US009874735B2

United States Patent
Giebink et al.

(10) Patent No.: US 9,874,735 B2
(45) Date of Patent: Jan. 23, 2018

(54) RESONANCE-SHIFTING LUMINESCENT SOLAR CONCENTRATORS

(71) Applicant: UChicago Argonne LLC, Chicago, IL (US)

(72) Inventors: Noel Christopher Giebink, Downers Grove, IL (US); Gary P. Wiederrecht, Elmhurst, IL (US); Michael R. Wasielewski, Glenview, IL (US)

(73) Assignee: UChicago Argonne, LLC, Chicago, IL (US)

( * ) Notice: Subject to any disclaimer, the term of this patent is extended or adjusted under 35 U.S.C. 154(b) by 417 days.

(21) Appl. No.: 14/457,590

(22) Filed: Aug. 12, 2014

(65) Prior Publication Data

US 2014/0376118 A1    Dec. 25, 2014

Related U.S. Application Data

(62) Division of application No. 13/199,323, filed on Aug. 26, 2011, now Pat. No. 8,841,548.

(51) Int. Cl.
*H01L 31/055* (2014.01)
*G02B 19/00* (2006.01)
*H01L 31/18* (2006.01)

(52) U.S. Cl.
CPC ..... *G02B 19/0028* (2013.01); *G02B 19/0042* (2013.01); *H01L 31/055* (2013.01); *H01L 31/1892* (2013.01); *Y02E 10/50* (2013.01); *Y02E 10/52* (2013.01)

(58) Field of Classification Search
CPC ... H01L 31/055; H01L 31/18; H01L 31/1892; G02B 19/0028; G02B 19/0042
See application file for complete search history.

(56) References Cited

U.S. PATENT DOCUMENTS

| 4,140,544 | A | 2/1979 | Sill |
| 4,144,097 | A | 3/1979 | Chambers et al. |
| 2004/0219450 | A1* | 11/2004 | Nagate ..... G03C 1/74 430/199 |
| 2007/0057264 | A1 | 3/2007 | Matsuda |
| 2009/0056791 | A1 | 3/2009 | Pfenninger et al. |
| 2010/0096009 | A1 | 4/2010 | Funayama et al. |
| 2011/0168236 | A1 | 7/2011 | Chan et al. |
| 2012/0086028 | A1 | 4/2012 | Beeson et al. |

OTHER PUBLICATIONS

Non-Final Office Action on U.S. Appl. No. 13/199,323 dated Mar. 12, 2013, 16 pages.

(Continued)

*Primary Examiner* — Golam Mowla
(74) *Attorney, Agent, or Firm* — Foley & Lardner LLP

(57) ABSTRACT

An optical system and method to overcome luminescent solar concentrator inefficiencies by resonance-shifting, in which sharply directed emission from a bi-layer cavity into a glass substrate returns to interact with the cavity off-resonance at each subsequent reflection, significantly reducing reabsorption loss en route to the edges. In one embodiment, the system comprises a luminescent solar concentrator comprising a transparent substrate, a luminescent film having a variable thickness; and a low refractive index layer disposed between the transparent substrate and the luminescent film.

9 Claims, 9 Drawing Sheets

(56) References Cited

OTHER PUBLICATIONS

Final Office Action on U.S. Appl. No. 13/199,323 dated Sep. 5, 2013, 18 pages.
Non-Final Office Action on U.S. Appl. No. 13/199,323 dated Jan. 29, 2014, 24 pages.
Notice of Allowance for U.S. Appl. No. 13/199,323 dated May 22, 2014, 7 pages.

* cited by examiner

RESONANCE-SHIFTING LUMINESCENT SOLAR CONCENTRATORS

CROSS-REFERENCE TO RELATED APPLICATIONS

This application is a divisional application of U.S. application Ser. No. 13/199,323 filed Aug. 26, 2011, reference of which is incorporated in its entirety.

STATEMENT OF GOVERNMENT INTEREST

The United States Government claims certain rights in this invention pursuant to Contract No. DE-AC02-06CH11357 between the U.S. Department of Energy and UChicago Argonne, LLC, representing Argonne National Laboratory.

FIELD OF THE INVENTION

The present invention relates generally to solar concentrators. More particularly, the present invention relates to systems and methods for improving the efficiency of luminescent solar concentrators.

BACKGROUND

The modernization and urbanization of developing countries places an increasing demand on supplies of fossil fuels and the use of such fuels places an increasing burden on the environment. As market demand drives fuel prices upward and as increased consumption accelerates environmental pollution, alternative energy sources become more economically feasible and socially popular. Among the various alternative energy sources, solar energy is one of the most promising due to the endless supply of free energy from the sun. One method of harnessing the sun's energy is through optical solar concentration.

Solar concentration is used in combination with traditional photovoltaic cells to reduce the area of cells necessary to generate a given amount of electrical energy. In particular, sunlight shining on a solar concentrator is optically concentrated and transmitted to a solar cell. Through optical concentration, or geometric gain, a smaller photovoltaic cell can be used to generate a given amount of electrical energy. By reducing the photovoltaic cell area necessary to generate a given amount of electrical energy, optical concentration reduces the cost of energy production.

There are two distinct approaches to solar concentration. One approach uses lenses or mirrors and tracks the sun throughout the day. This tracking approach can produce very high concentration (e.g. greater than 500 suns) but requires tracking to within 0.1 degree and, therefore, is expensive and susceptible to tracking errors that may reduce performance. Another approach does not track the sun. One example of this non-tracking approach uses fixed lenses and mirrors, which produces relatively low concentration (e.g. less than 5 suns). Another example is the luminescent solar concentrator (LSC).

Optical solar concentration provides a realistic, near-term prospect for leveraging the cost and expanding the generation capacity of today's established solar cell technologies. The maximum concentration ratio (CR) obtainable using linear geometric optical systems involving lenses, mirrors, or diffractive optics, is fundamentally limited by the acceptance angle ($\theta_{acc}$) of the system and the refractive index ($n_{out}$) at its output aperture through the well-known sine law, $CR \leq (n_{out}/\sin \theta_{acc})^2$. Maintaining high concentration (CR>100) throughout the day thus demands that these concentrators track the sun with high precision, which drives up both capital and maintenance costs of the overall system.

LSCs were developed in the 1970s and have a high fundamental concentration (e.g. greater than 100 suns). LSCs were introduced as an alternative, non-tracking approach that preserves, at least in principle, the potential for high concentration. However, technical issues have limited the utility of LSCs to date. LSCs provide a simple means to concentrate sunlight without tracking the sun. These devices operate by absorbing light and then re-emitting it at lower frequency, typically into the confined modes of a transparent slab, where it is transported toward photovoltaic cells attached to the edges. In the thermodynamic limit, concentration ratio exceeding the equivalent of 100 suns is possible, however, in actual LSCs, optical propagation loss due mostly to reabsorption limits the concentration ratio to approximately 10.

In contrast to their 'passive' geometric optical counterparts, LSCs actively shift the optical frequency by absorbing sunlight and re-emitting it with a finite Stoke's shift into the confined optical modes of, e.g. a transparent slab, where it is trapped by total internal reflection and absorbed by photovoltaic cells attached to the edges. The limiting concentration ratio for an LSC follows from thermodynamic considerations and is exponential in the Stoke's shift according to $CR_{lim} \approx (e_{em}^3/e_{abs}^3)\exp[(e_{abs}-e_{em})/k_bT]$, where $e_{abs}$ and $e_{em}$ are the absorbed and emitted photon energies, respectively. This theoretical maximum exceeds the equivalent of 100 suns for most emitters employed in LSCs to date, yet the value realized in practice is more than an order of magnitude lower, typically in the range 2<CR<10, which remains too low to provide any economic benefit in reducing the cost of photovoltaic power. The following provides a new approach to LSC optical design that enables a doubling or more in CR for any type of emitter, thereby improving the prospect of low-cost, high-performance luminescent concentration.

SUMMARY

Various embodiments of the present invention comprise an all-optical system and method to overcome LSC problems by 'resonance-shifting', in which sharply directed emission from a bi-layer cavity into the glass substrate returns to interact with the cavity off-resonance at each subsequent bounce, significantly reducing reabsorption loss en route to the edges. Near-lossless propagation is demonstrated for several different chromophores that ultimately enables a more than two-fold increase in concentration ratio over that of the corresponding conventional LSC.

In one embodiment, a luminescent solar concentrator is provided, comprising a transparent substrate, a luminescent film having a variable thickness, and a low refractive index layer disposed between the transparent substrate and the luminescent film. In another embodiment, a method for increasing the efficiency of a luminescent solar concentrator is provided. In this embodiment, the efficiency is increased by providing a low refractive index layer to a surface of the transparent substrate and providing a luminescent film of laterally varying thickness to a surface of the a low refractive index layer, such that the low refractive index layer is disposed between the transparent substrate and the luminescent film. In another embodiment, a method of directing light is provided. In this embodiment, light is directed by absorbing a light at a first location in a luminescent film, emitting the light through a low refractive index layer into a transparent substrate, the emitted light evanescently coupled into the transparent substrate, reflecting the light from a bottom boundary of the transparent substrate, and reflecting the light from a second location in the luminescent film laterally displaced from the first location, wherein the light exhibits non-resonant near-unity reflectivity.

These and other features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

The patent or application file contains at least one drawing executed in color. Copies of this patent or patent application publication with color drawing(s) will be provided by the Office upon request and payment of necessary fee.

FIG. 1a is an illustration of the resonance-shifting concept, where a thin luminescent film layer is separated from a glass substrate by a low refractive index ($n_{low}$~1.14) layer; FIG. 1b illustrates the same sequence as FIG. 1a, but is from the perspective of internal substrate angle, where the reflectivity dip due to reabsorption loss shifts to higher angle for the thicker luminescent film, with near-unity reflectivity at the original emission resonance.

FIG. 2a depicts the thin-film absorption (dash-dot lines) and emission spectra (solid lines) of three luminescent materials (green-emitting polymer poly (9,9-di-n-octylfluorene-alt-benzothiadiazole) ("F8BT") and two perylene-based Lumogen F-series dyes ("L170" and "L305" respectively)), illustrating various self-absorption overlaps (photoluminescence spectra for each material were collected normal to the film surface and scaled to the absorption peak); FIG. 2b depicts emission and reflectivity patterns measured for a bi-layer F8BT cavity as a function of angle in the glass substrate where the plots with circles and the plots with squares (right-hand scale) indicate reflectivity of the bare cavity obtained at $\lambda$=543 nm whereas the emission (left-hand scale) was detected through a $\lambda$=550 nm bandpass filter. The bare cavity emission peaks (bowtie-shaped symbols) correspond to the resonant reflectivity dips, where the slight mismatch in peak angle and broadening of emission relative to the reflectivity are due to the center wavelength difference and bandwidth of the filter, respectively. Evaporating 30 nm of $Alq_3$ onto the F8BT increases the cavity phase and shifts the emission peaks to higher angle ("x"-denoted plot), off-resonance with the bare reflectivity as indicated by the dashed arrows. Solid lines indicate fits to a transfer matrix-based model as discussed in the text.

FIG. 3a is a schematic of the experimental geometry, where a Si photodiode, index-matched to the sample edge, records the luminescence intensity generated by laser excitation as a function of distance, x. The cross-hatched vertical stripe indicates a resonance-shifted region of the sample with increased cavity thickness. Photographs 1, 2, and 3 show the progression of directional emission rings from the F8BT cavity of FIG. 2b as the excitation spot approaches the resonance-shifted stripe indicated by the arrow. Ring components that cross from one region to another disappear as they become non-resonant. FIG. 3b depicts internal optical quantum efficiency measured as in (a) for complementary F8BT cavities, showing an increase in edge emission upon crossing over the resonance-shifted region of each. The LSC control is identical to the cavities except that it has no low-n spacer layer. Estimating the propagation efficiency from these measurements (right-hand scale) shows that resonance-shifted emission propagates with near-zero loss. FIG. 3c illustrates the progression of edge emission from the RS+ sample (see the inset of FIG. b) viewed on a white card as the excitation point is moved farther from the edge. Near the edge (x=0.5 and 2.5 mm), emission moves from one side to another as shown in the diagram. Crossing from x=29 mm into the resonance-shifted stripe at x=31 mm leads to the recovery of additional green emission indicated by the white arrows due to reduced reabsorption loss.

FIG. 4a depicts internal optical quantum efficiency (IQE) measured for the L305 control LSC and complementary resonance-shifted cavities. The intensity decrease in the RS+ stripe is due to a decreased emission quantum yield into the substrate; it is regained in the large RS– increase. Propagation efficiency is deconvolved from the changes in emission quantum yield and displayed on the right hand scale. FIG. 4b depicts edge-emission spectra, collected through the port of an integrating sphere as shown in the inset. The spectra are normalized to one another at long wavelengths ($\lambda$>740 nm) to calculate the self-absorption ratios shown in the inset. The resonance-shifted spectrum (denoted 33 mm) recovers high-energy emission that would otherwise be lost to reabsorption, as in the trace denoted 30 mm. FIGS. 4c-d depict simulated IQE and emission spectra corresponding to the measurements in FIGS. 4a and 4b as calculated using the structure, optical constants and photoluminescence spectrum of L305.

FIG. 6a depicts and extension of the simulations in FIGS. 4c and 4d to predict the power emitted from one edge of an L305-based RSLSC and LSC control under uniform area illumination as in FIG. 5c. Both the magnitude of the RSLSC enhancement and the trend in power ratio are similar to that observed experimentally in FIG. 5d. FIG. 6b depicts the same simulation accounting for emission from all four edges and extended to larger geometric gain. Here, the L305 photoluminescence quantum yield is set to 98% and the concentration ratio is calculated explicitly, clearly illustrating the benefit of reduced loss obtained by resonance-shifting.

FIGS. 8(a) and (c) illustrate the TE and TM reflectivity profiles, respectively. The reabsorption loss, given by 1−R, is significantly lower off-resonance in both polarizations for the cavity than for the same F8BT film on glass. FIGS. 8(c) and (d) show the optical field intensity profile calculated for the structure at the (off-resonance) angles indicated by the dashed arrows in (a) and (c). The field intensity is much lower in the F8BT film off resonance than it is for the control F8BT film on glass, which is the physical basis for the reduced reabsorption in the case of the cavities.

DETAILED DESCRIPTION OF VARIOUS EMBODIMENTS

Figure 1:
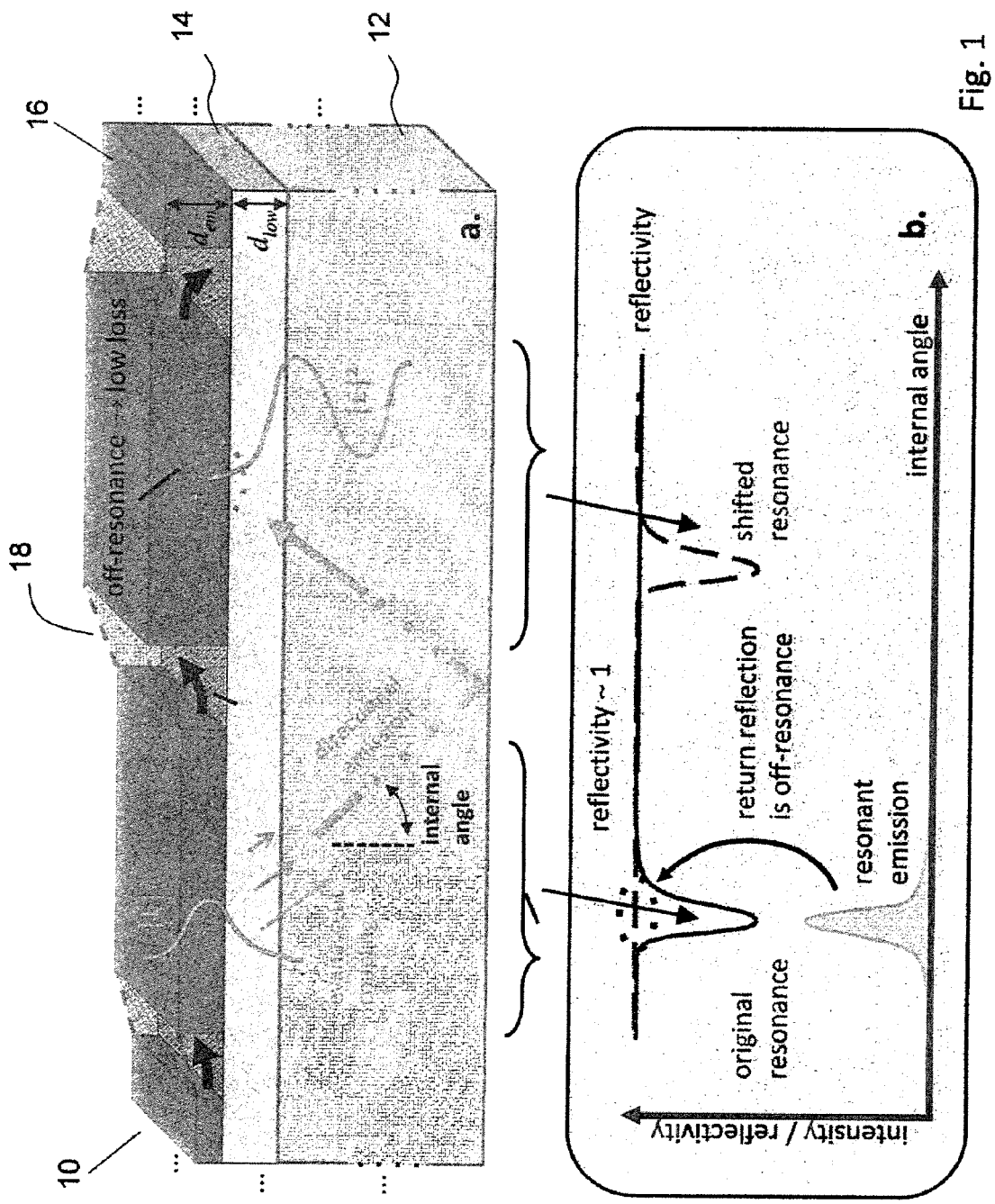
FIGS. 1a and 1b illustrate the resonance-shifting concept applied to a luminescent solar concentrator.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Concentration ratio is defined as the ratio of output to input radiant flux, and in the case of LSCs 10, it is factored according to $CR = G\eta_{opt}$, where the geometric gain $G = A_{out}/A_{in}$ is the ratio of output to input aperture areas and $\eta_{opt} = P_{out}/P_{in}$ is the efficiency of power transfer from sunlight incident on the concentrator (Pin) to that of the luminescence at its output (Pout). The optical efficiency is often approximated as a product, $\eta_{opt} \approx \eta_{abs}\eta_{Stokes}\eta_{em}\eta_{prop}$ (G), which depends on the absorbed fraction of the solar spectrum ($\eta$abs), the fractional photon energy loss in downconversion ($\eta$Stokes), and the probability of re-emission into confined modes ($\eta$em). The final factor, $\eta$prop, accounts for all propagation-related losses due to reabsorption and scattering and hence, in contrast to the other losses, is a naturally decreasing function of G. It is this functional dependence that is ultimately responsible for the low CR achieved in practice since, if $\eta$prop were constant, G could simply be increased to compensate for the other losses.

The falloff of $\eta$prop with increasing G is predominantly due to self-absorption by the luminescent material, in which emitted photons are reabsorbed by the tail of the absorption spectrum and then subsequently lost due to non-radiative decay or secondary re-emission out of the waveguide. One strategy for combating this problem is to minimize the overlap between absorption and emission spectra by increasing the Stoke's shift, either via cascaded energy transfer or the use of emitters with intrinsically large shifts, such as rare-earth ions and phosphorescent organic molecules. This approach has recently shown great promise for LSCs 10 based on organic thin films, however, it is not easily applicable to other emitters such as colloidal quantum dots due to their large self-absorption overlap, and more fundamentally, it does not improve CR relative to the thermodynamic limit since CRlim also grows with increasing Stoke's shift, as noted above. Alternatively, wavelength-selective filters have been used to reduce out-coupling of photons re-emitted within the critical angle, but this can adversely affect the in-coupling of direct and diffuse sunlight at wide angles and it ultimately does not resolve the non-radiative component of reabsorption loss.

Resonance-shifting addresses the reabsorption problem differently in that it relies on emission from optical resonances that change with position across the concentrator, such that subsequent interactions with the emissive region are non-resonant with greatly diminished reabsorption. FIG. 1a illustrates a simple implementation of this concept, in which a thin film of the luminescent material, typically a micron or less in thickness, $d_{em}$, is separated from a glass or other transparent substrate 12 by a layer with low refractive index (here nlow~1.14, though can range from about 1.1 to about 1.2) and thickness, $d_{low}$. This structure constitutes an evanescently coupled bi-layer cavity, in which slab waveguide modes supported by the emissive thin-film become leaky (into the substrate 12 of similar refractive index) when the low refractive index (low-n) layer thickness is on the order of half the emitted wavelength. Emission into these modes is favored on account of their increased photonic density of states and hence a large fraction (typically 60-90%) of the thin-film photoluminescence can be coupled into the glass substrate 12 at sharply defined angles (see FIG. 1b) corresponding to each discrete mode.

These modes, by nature, cannot propagate in air and hence the directional emission undergoes total internal reflection at the opposing glass/air interface and returns to the emitter/low-n bi-layer laterally displaced by roughly twice the substrate 12 thickness. If the waveguide thickness (e.g. the luminescent film 16) were to remain unchanged from the original emitting position, the emitted light would be resonantly coupled back into the slab waveguide and reabsorption would be intensified. However, if the original emission returns to find a different waveguide thickness, then it will be non-resonant with the new cavity modes and the reflectivity, R, may consequently approach unity. Since no light is transmitted under conditions of total internal reflection, reabsorption loss, given by the balance 1−R, is drastically reduced.

From a physical standpoint, the decrease in reabsorption is due to reduced overlap of the optical field intensity profile ($|E|^2$) with the luminescent film 16, as illustrated in FIG. 1a. Off resonance, the optical fields decay evanescently from the glass substrate 12 through the lossless low-n layer such that only the tail of the intensity profile samples the luminescent film 16. By contrast, the intensity overlap, and hence reabsorption, is much larger in conventional thin-film LSCs 10 (e.g. luminescent film 16 on a glass substrate 12) since the optical fields do not decay before reaching the emissive layer. This point is further illustrated below through calculation of the field profiles (equations 1-4).

The scheme shown in FIG. 1 works bi-directionally, that is, emission from the left-hand side is non-resonant on the right-hand side and vice versa. It is also broadband since the dispersion of each mode ensures that its propagation constant (i.e. resonant angle) changes with wavelength. Hence, light at each emission wavelength couples into the substrate 12 at its own unique set of angles and then propagates independently through the concentrator; in short, different wavelengths are not subject to the resonances of one another.

The goal in designing a resonance-shifting luminescent concentrator (RSLSC) is thus to vary the thickness of the luminescent film 16 across the surface of the concentrator such that resonant emission from any given location does not re-encounter that same resonance in reflectivity elsewhere before reaching the RSLSC edges. The required thickness variation 18—typically a few tens of nanometers over a lateral distance of approximately twice the substrate 12 thickness (i.e. the return length between bounces)—is determined by the resonance width, which in turn depends on modal coupling to the substrate 12 through dlow as well as the extinction coefficient of the emissive layer.

Figure 2:
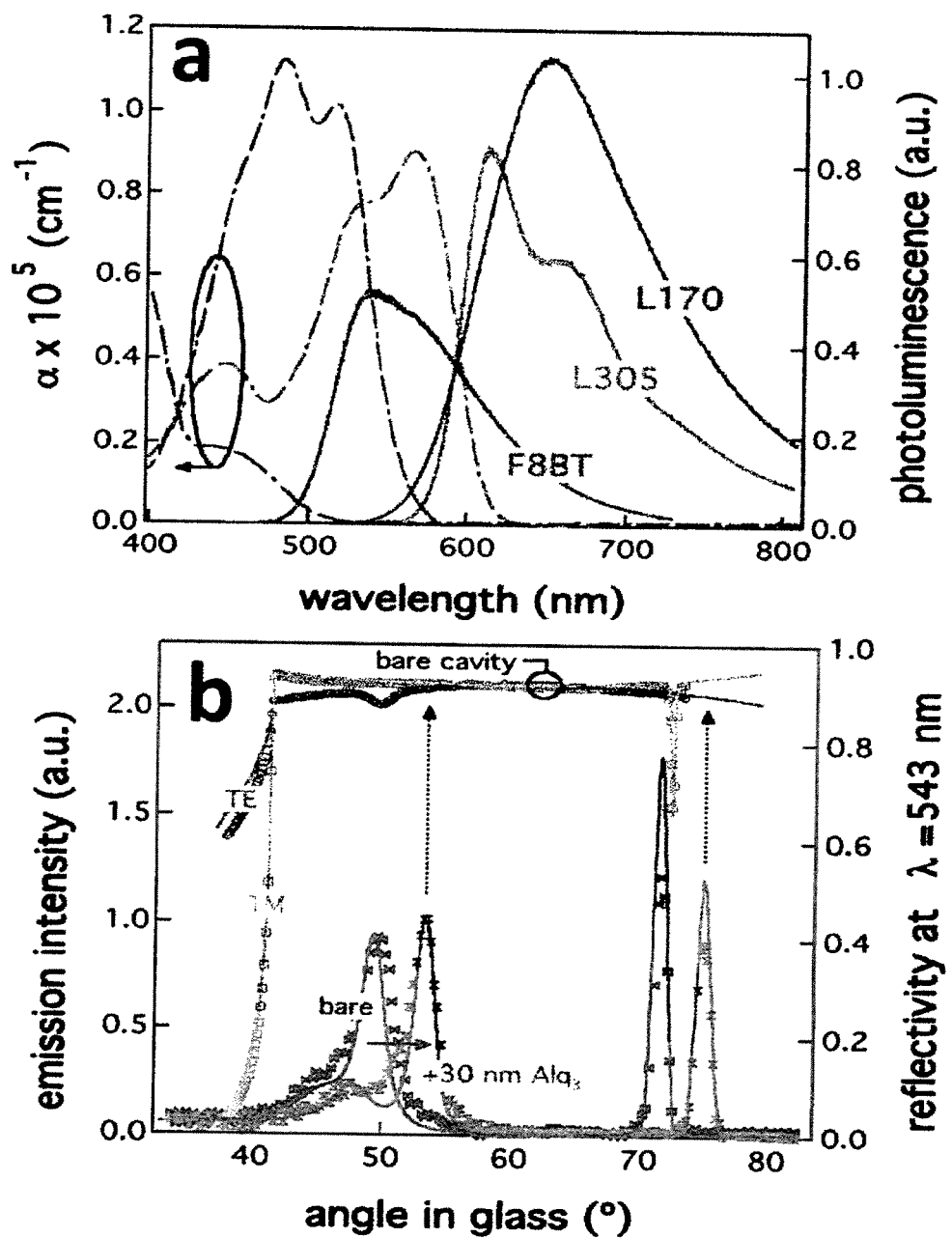
FIGS. 2a and 2b depict the emitter and bi-layer cavity characteristics.

The RSLSC strategy was tested for three different luminescent materials, namely, the green-emitting polymer poly (9,9-di-n-octylfluorene-alt-benzothiadiazole) (F8BT) and two perylene-based Lumogen F-series dyes (denoted here as L170 and L305) that are commercially available from BASF Corporation and are routinely used in LSCs 10. FIG. 2a presents the thin-film absorption and emission spectra of each material, which feature varying degrees of self-absorption overlap and photoluminescent quantum yields, measured in an integrating sphere, that range from φPL=0.75±0.04 for F8BT to 0.44±0.03 and 0.03±0.01 for L170 and L305, respectively. φPL is near unity for the Lumogen dyes dispersed in a host matrix, however, testing capabilities were restricted to thermal evaporation of neat films where the luminescence is self-quenched. Nevertheless, this collection of emitters, together with both standard borosilicate and high-index SF10 glass substrates 12, provides a broad test-bed from which to assess the effectiveness of the RSLSC approach. As explained in further detail below, while these three emitters have been tested, other emitters, such as colloidal quantum dots and organic dyes used in conventional luminescent concentrators, may be used to achieve similar results.

Figure 7:
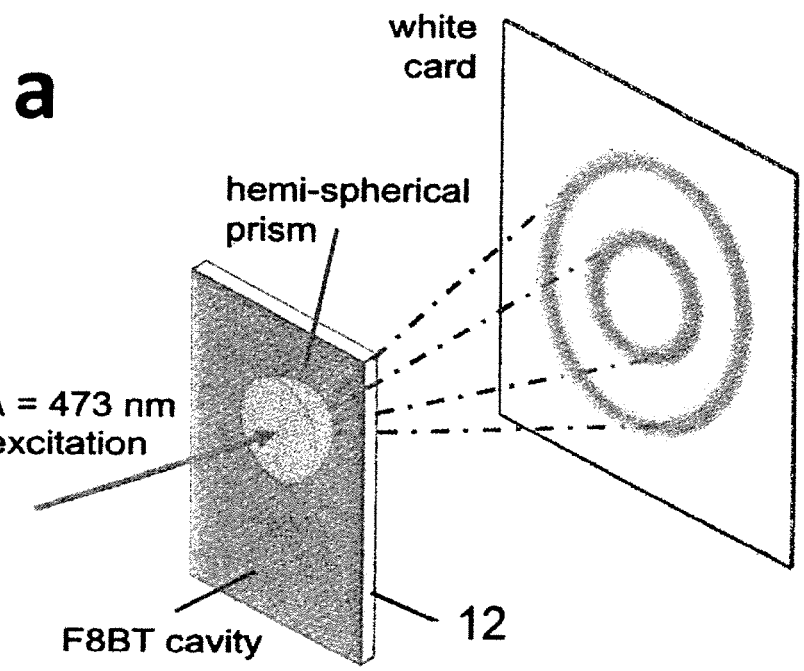
FIG. 7a illustrates emission outcoupling from the bi-layer cavity via a half-ball lens, showing the highly direction rings of emission projected onto a screen.
FIG. 7b depicts typical emission rings from an F8BT cavity similar to that in FIG. 3b.
Figure 7:
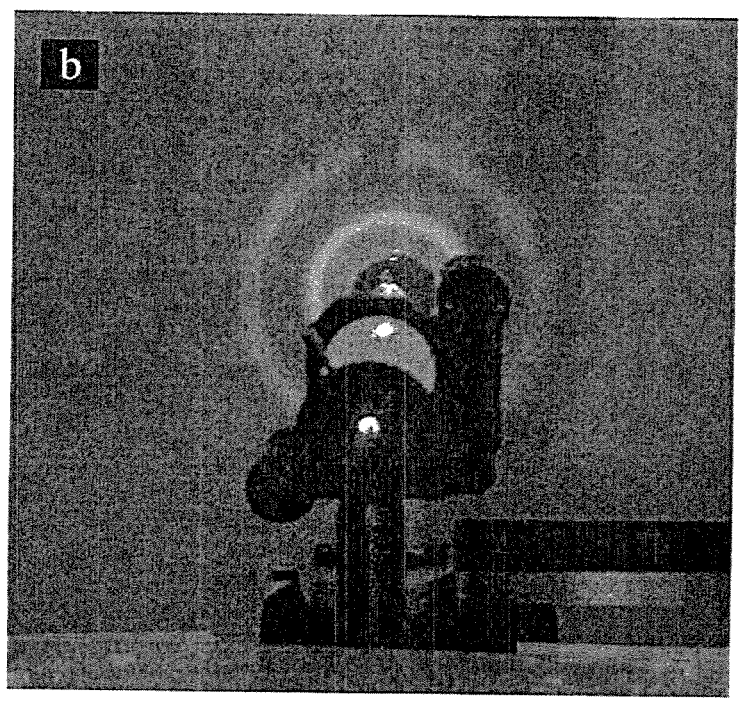

The angular emission pattern of an F8BT/low-n bi-layer, fabricated as previously by spin-coating on a glass microscope slide (1 mm thick) and out-coupled using a hemispherical prism, is shown in FIG. 2b by the plot with bowtie symbols. The cavity exhibits highly directional emission, visible as rings by eye (FIG. 7) that consist of two dominant peaks at angles (in glass) of θ~49° and θ~72° that correspond to transverse electric and magnetic TE1 and TM0 modes, respectively. The angularly directed emission of F8BT cavities is easily seen by eye when out-coupled with a hemispherical prism as shown in FIG. 7a. A photograph showing the typical emission ring pattern observed from an F8BT cavity is shown in FIG. 7b, where the color change from the inner to outer edge of each ring reflects the modal dispersion in the waveguide.

The transverse electric and magnetic TE1 and TM0 modes are also evident in the prism-coupled angular reflectivity spectra (FIG. 2b, plots with circles and plots with squares, right-hand axis), where the small mismatch in mode position between emission and reflectivity is due to dispersion since they are measured at slightly different wavelengths, with reflectivity recorded at λ=543 nm and emission collected through a λ=550 nm bandpass filter (Δλ=10 nm). As shown by the solid lines, both emission and reflectivity data are well-reproduced by standard transfer matrix models, with optical constant inputs and dem=267±3 nm and dlow=230±8 nm determined from spectroscopic ellipsometry.

In contrast to the 'bare' F8BT cavity, the emission pattern denoted by "x" symbols in FIG. 2b has been shifted to higher angle by thermally evaporating 30 nm of the organic semiconductor tris (8-hydroxyquinoline) aluminum (Alq3) onto the F8BT surface. The Alq3 layer is transparent to the λ=473 nm excitation wavelength and has a similar refractive index to F8BT, thus it serves only to increase the cavity phase and shift the emission peaks away from the bare cavity reflectivity resonances as shown by the dashed arrows. A closer examination of the reflectivity fitting (provided below) shows that loss due to reabsorption (e.g. 1−R) in the off-resonance locations averages over an order of magnitude less than it would be for conventional LSCs 10 (e.g. dlow=0 nm) with the same F8BT film.

Figure 3:
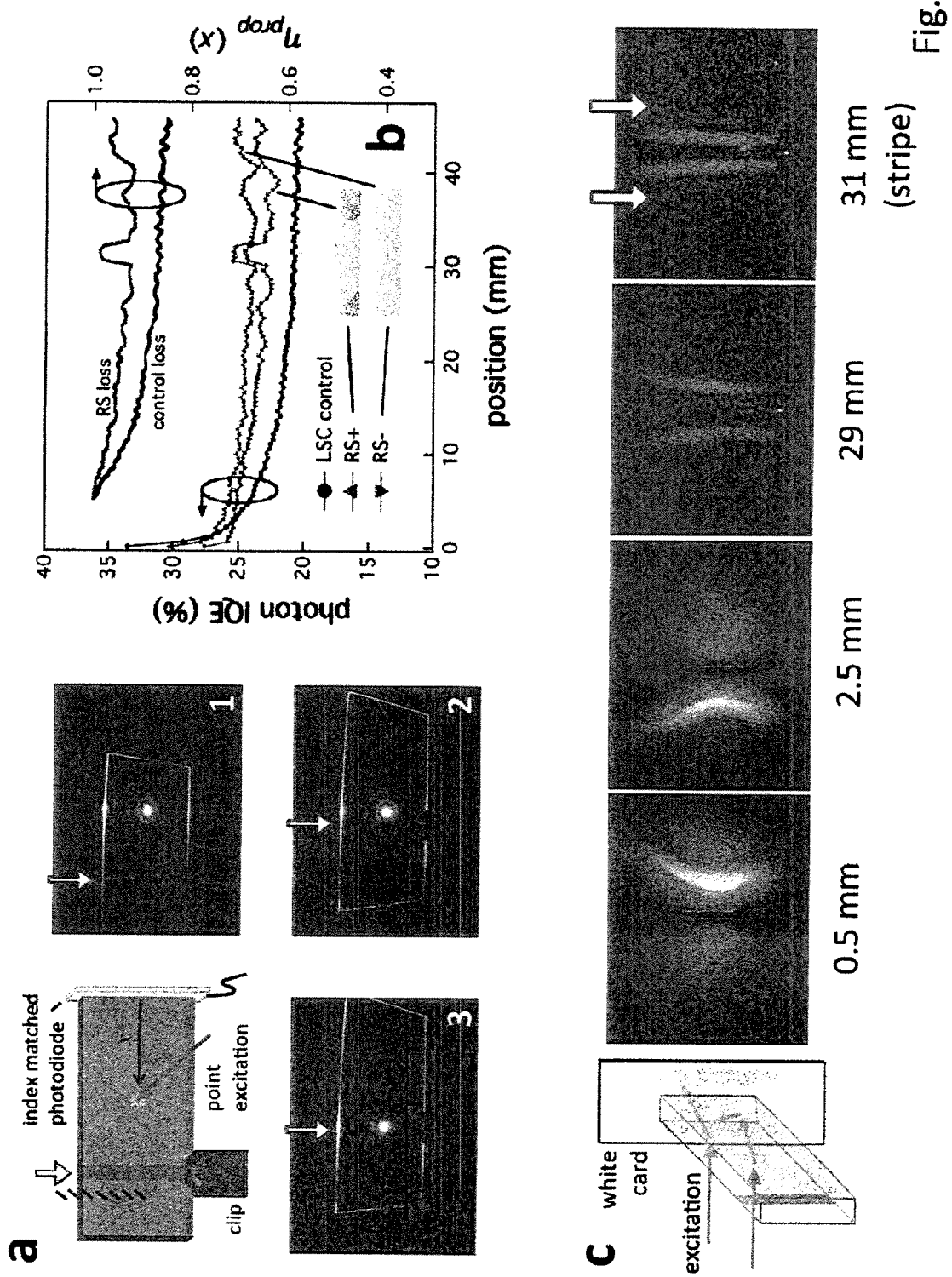
FIGS. 3a-c illustrate resonance-shifting with F8BT.

FIG. 3 presents a more visually striking demonstration of resonance-shifting and its capability to reduce loss. The experimental setup is shown in the upper-left panel of FIG. 3a, where a Si photodiode 20 is index-matched to one edge of the substrate 12 and a laser excitation spot is scanned along the middle of the sample. The upper-right photograph (panel 1) shows the result of exciting the bare F8BT cavity, where several emission rings surrounding the central excitation point are visible. These rings correspond to reflections of the directional emission that are resonantly reabsorbed and re-emitted, or scattered out of the glass upon each subsequent interaction with the cavity. In the photograph below (panel 2), the excitation spot is translated adjacent to a 2 mm wide, 30 nm thick Alq3-resonance-shifted stripe indicated by the white arrow. Ring components within the stripe are no longer visible since they are non-resonant and remain trapped within the glass. Similarly, in panel 3, when exciting at the center of the stripe, ring components outside the stripe disappear since they are now non-resonant with the bare cavity.

FIG. 3b shows the internal optical quantum efficiency (IQE), or fraction of photons absorbed at the excitation spot that are re-emitted and detected by the photodiode 20. A clear increase in edge emission is observed when the excitation point crosses over the resonance-shifted stripe (RS+). However, to rigorously ascribe this change to reduced propagation loss, as opposed to a change in quantum yield of the cavity emission into the substrate 12, the inverse configuration (RS−) as shown in the inset was tested, where the 'stripe' region is left bare and 30 nm of Alq3 is deposited elsewhere. The similar result evident in the RS− case confirms that the increase is due to reduced propagation loss.

Combining the IQE data of both RS+ and RS− enables the resonance-shifted propagation loss to be deconvolved from the changes in substrate-coupled emission quantum yield that accompany the variation 18 in cavity thickness and thus calculate a single, 'average' propagation efficiency, ηprop (x), which is further explained below. According to the right-hand scale of FIG. 3b, after propagating 25 mm, emission in the LSC 10 control is reduced to ~85% of its initial intensity, whereas in the resonance-shifted case, it recovers to near 100%, illustrating the capability for low loss propagation.

FIG. 3c shows the progression of emission emanating from the edge of RS+ and projected onto a white card. Exciting adjacent to the edge (x=0.5 mm), the directional emission exits to the right-hand side without undergoing any bounces, as depicted in the initial illustration. At x=2.5 mm, the emission undergoes a single bounce and now exits to the left-hand side. As the excitation point moves far from the edge (x=29 mm), the emission intensity out each side becomes similar since the TE and TM modes are emitted at different angles and thus do not remain in step with one another. Upon exciting the resonance-shifted stripe (x=31 mm), additional green emission appear, indicated by the white arrows, which contributes to the intensity increase recorded by the photodiode 20 in FIG. 3b. Since the high energy, green component of F8BT emission is most strongly attenuated by the absorption tail, it is the dominant component recovered when loss is reduced by resonance-shifting.

Figure 4:
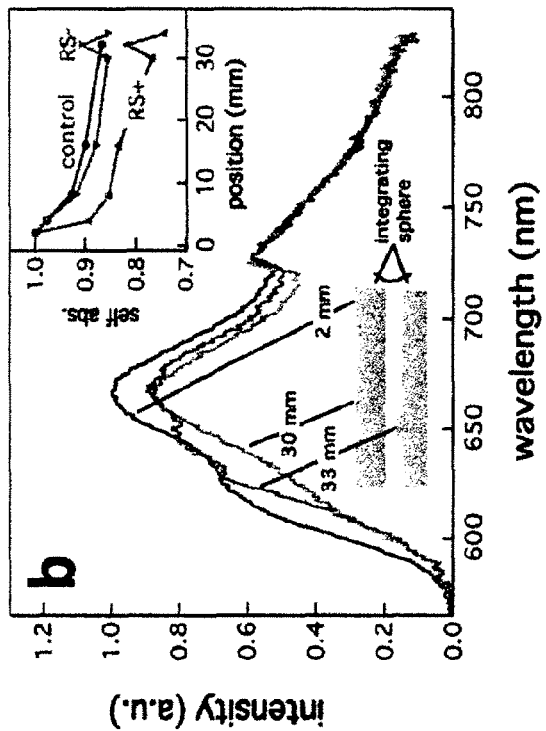
FIGS. 4a-d depict an analysis of resonance-shifting with L305.
Figure 4:
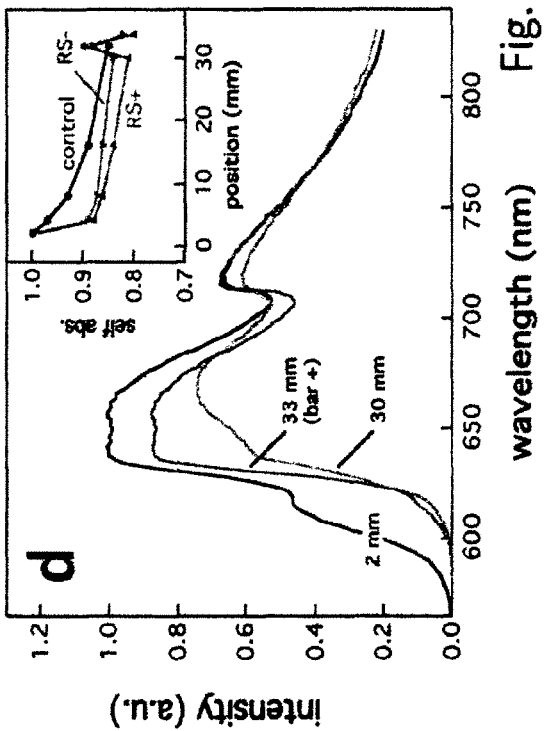
Figure 4:
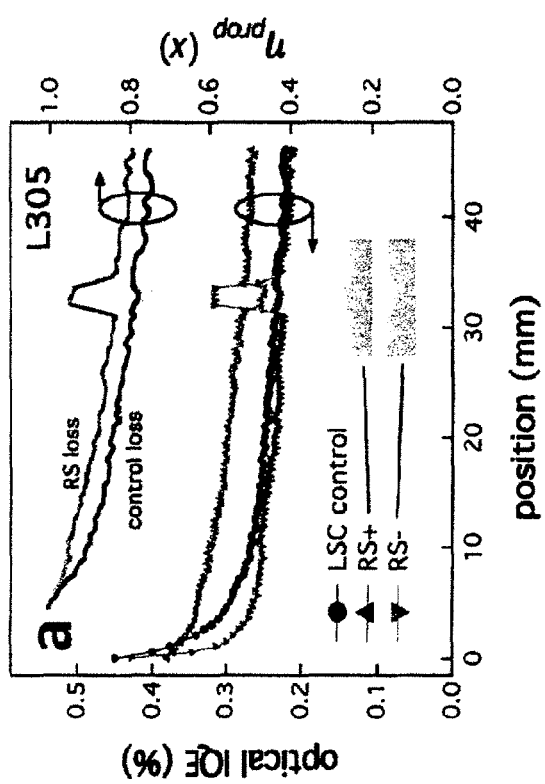
Figure 4:
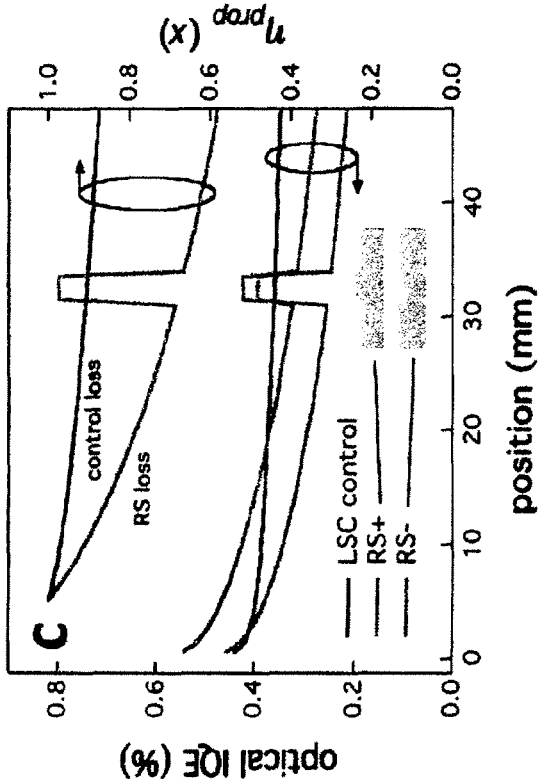

Although F8BT provides a qualitatively useful visual demonstration, a more in-depth analysis is complicated by the natural, uncontrolled thickness variation 18 inherent in the spin-coated films. Rigorous experimental and modeling analysis instead focused on more uniform devices fabricated by thermally evaporating films of L170 and L305. FIG. 4 shows the results obtained for the L305 control, RS+, and RS− structures, where dlow=230±8 nm and dem=150±4 nm, with a 30 nm thickness change in the resonance-shifted stripe. FIG. 4a illustrates an IQE decrease in the RS+ stripe and a significantly larger magnitude IQE increase in the RS− stripe. This indicates a significant change in the yield of substrate-coupled emission between the two cavity thicknesses, with the dem=150 nm cavity emitting more efficiently into the glass than the dem=180 nm cavity. This change is more significant than for F8BT in FIG. 3b primarily because the resonance shift in the L305 cavity is accompanied by the onset/disappearance of an available TE0 mode over a large portion of the L305 photoluminescence spectrum. Nevertheless, when propagation efficiency is deconvolved from the changes in emission quantum yield, the resonance-shifted stripe recovers to 96% of its starting value, whereas the control LSC 10 drops to 78% (FIG. 4a, right-hand axis), representing an approximately 5-fold reduction in loss.

FIG. 4b shows the edge emission spectra of the L305 complementary devices collected through the port of an integrating sphere as shown in the inset diagram. The spectra are strongly modified from the photoluminescence in FIG. 2a and all exhibit a discontinuous 'kink' at λ~720 nm that corresponds to onset of the TE0 mode and increased emission at longer wavelengths. Self-absorption (SA) ratio, plotted in the inset, is determined by normalizing the spectra to one another at long wavelengths (λ>740 nm) where reabsorption is negligible and then calculating the spectrally integrated intensity decrease relative to the initial spectrum obtained exciting at x=2 mm from the edge. The SA ratio thus quantifies the red-shift in luminescence spectrum that typically occurs as light propagates through an LSC 10, with high SA ratios (i.e. near unity) indicating little reabsorption and vice versa. The inset of FIG. 4b illustrates an increase in SA ratio for both RS+ and RS− resonance-shifted stripes, due mostly to the recovery of strongly absorbed, high-energy spectral components as evident from the difference in x=30 mm and x=33 mm spectra. The data and trends obtained for the L170 cavity are similar to those in FIGS. 4a and 4b, as are those for L170 and F8BT cavities on high-index SF10 substrates 12.

FIGS. 4c and 4d present simulated optical IQE and edge emission spectra that correspond to the measurements in FIGS. 4a and 4b. Briefly, the simulations involve calculating the cavity emission and angular reflectivity profiles at each wavelength and then integrating over all propagation paths, accounting for reflectivity loss at each bounce en route to the substrate edge; details are provided below. Overall, the simulations are in reasonable qualitative agreement with the data, reproducing the TE0 onset 'kink' and high-energy emission recovery in the spectra of FIG. 4b as well as the optical IQE magnitude and trends in FIG. 4a. The discrepancy in sign change of the RS+ stripe between FIGS. 4a and 4c implies that the predicted cavity-modified emission quantum yields are not fully accurate, though the trend is correct insofar as the RS− increase exceeds that of RS+. Additionally, the simulations predict greater optical loss for the un-shifted regions of each cavity as compared to the control LSC 10, which is intuitively expected since emission in the un-shifted regions undergoes resonant loss at each bounce. Indeed, it is not currently clear why the un-shifted portions of RS+ and RS− decrease at nearly the same rate as the control in the data of FIG. 4a. Secondary re-emission events not accounted for in the model and slight deviations in the substrate 12 surface planarity that naturally return light off-resonance may contribute to this discrepancy.

These results demonstrate the potential of resonance-shifting to reduce propagation loss, but whether this can ultimately be harnessed to net benefit in an actual RSLSC consisting of many such shifts is most directly addressed by measurement under operating conditions. This is shown schematically in FIG. 5a, where a fully patterned RSLSC is illuminated uniformly over an increasingly larger area, which corresponds directly to increasing the geometric gain G=x/t, where t is the substrate 12 thickness. The RSLSCs are patterned with a repeating 6-level stair step pattern, with step widths and heights of 2 mm and 30 nm, respectively.

FIG. 5b shows that the RSLSC with an F8BT emissive layer outperforms its LSC 10 counterpart, delivering more luminescence to the edge-mounted photodiode 20 despite absorbing less of the incident light on average (lower panel). The result is similar for L305 in FIG. 5c, where the RSLSC and LSC 10 control have nearly identical absorption, yet the RSLSC moves from delivering less power at small G to more power at large G. The ratio of RSLSC to LSC 10 output power thus increases with geometric gain. This increase can only be explained by lower overall propagation loss in the RSLSC since it is the only factor that depends on G. FIG. 5d summarizes this ratio for all of the emitters on both borosilicate and high-index SF10 glass. The increasing trend evident in every case confirms that resonance-shifting is a highly robust method of reducing reabsorption loss in luminescent concentrators. The opposite trend is observed in control experiments comparing conventional LSCs 10 with differing dem, where, as expected, the delivered power ratio of thick to thin devices decreases with increasing G due to higher loss in the thicker films.

FIG. 6a extends the L305 simulation in FIGS. 4c and 4d to model the area excitation experiment, where for simplicity, an ideally patterned RSLSC is used in which emission from a given point never re-encounters its own reflectivity resonance. The model reproduces the trend in power ratio observed in the data of FIG. 5d, predicting the same ~10% enhancement at G=50 realized by resonance-shifting. However, accounting for emission from the other three edges and extending the same simulation to larger geometric gain in FIG. 6b shows that the improvement grows markedly with increasing concentrator size due to the amplified benefit of loss reduction. Indeed, whereas the LSC 10 concentration ratio saturates at CR~10 (ηopt=2%), that of the RSLSC reaches CR=24 (ηopt=4.8%) at G=500, reflecting a 2.4× increase that is still growing. Here, the use of an external back reflector is assumed to double the absorption path length of sunlight through the L305 film (ηabs=0.26, ηStokes=0.73) and that the photoluminescent quantum yield is increased to 98% as it is when L305 is dispersed in a host matrix. Because the improvement in concentration ratio hinges entirely on reduced RSLSC propagation loss, there may be even greater relative benefit for single-sided collection when the other edges are silvered due to the overall increase in path length to the solar cell.

Figure 5:
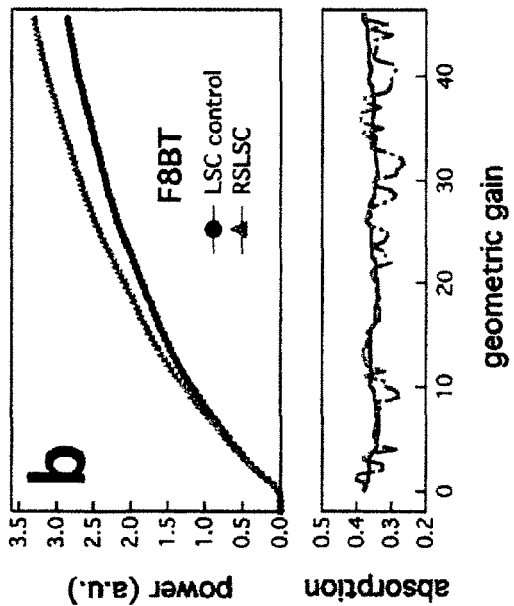
FIG. 5a illustrates measurement of concentrator performance under operational conditions, in which the area of uniform illumination (geometric gain) is varied as shown. The photodiode is covered (not shown) to prevent it from receiving direct illumination. The resonance-shifting pattern is a 6-level staircase with 2 mm wide steps as shown.
FIG. 5b depicts edge detected luminescence power collected for an F8BT control LSC and RSLSC. The lower panel shows the absorption measured along the center of each concentrator.
FIG. 5c depicts results of the same experiment performed with L305-based devices. The absorption of each (lower panel) is nearly identical and clearly shows the step-like thickness variation.
FIG. 5d depicts ratio of the edge-detected RSLSC power to that of the corresponding LSC control for the three emitters on borosilicate and high-index SF10 glass substrates, with $d_{low}$=230 nm in each case and base layer thicknesses of 267 nm and 150 nm for the F8BT and Lumogen devices, respectively. An increasing ratio for each with geometric gain indicates reduced propagation loss in the RSLSC.
Figure 5:
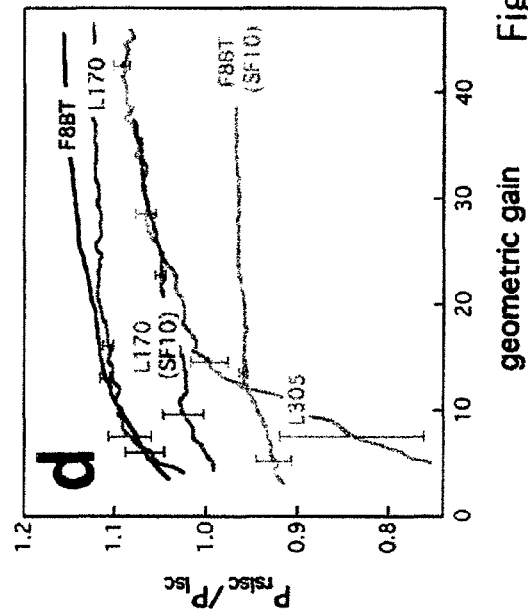
Figure 5:
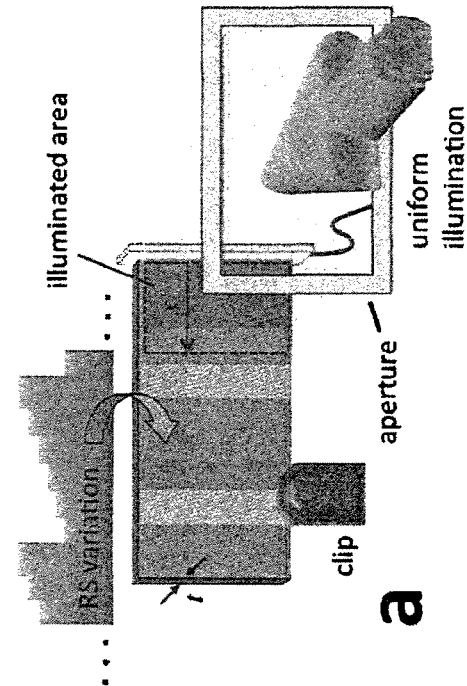
Figure 5:
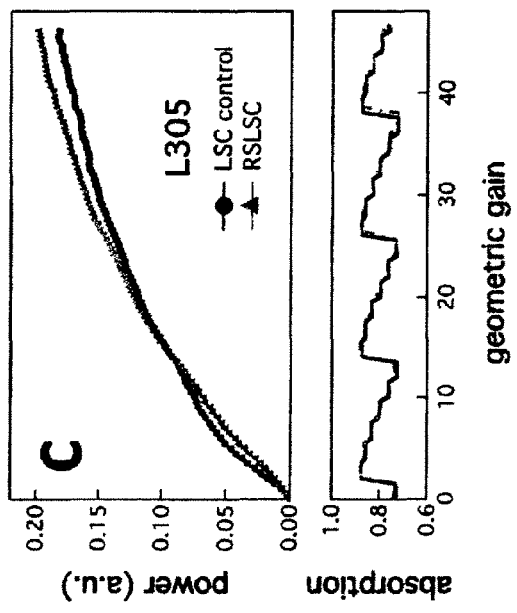

For certain embodiments, the stair step thickness variation 18 used in FIG. 5 may not be the optimum way to pattern an RSLSC. As emission from each resonance has a different return-length to the luminescent film 16 depending on its emission angle and the substrate 12 thickness, RSLSCs present a complex optimization challenge that will likely require ray tracing in combination with thin-film optical modeling to determine the emission pattern, efficiency, and reflectivity at each point on the surface, for each wavelength in the emission spectrum. The goal is to determine how best to pattern lateral variation 18 in the luminescent film 16 thickness to maximize the non-resonant path length of emission from each point to the collecting edge(s) subject to a finite number of available resonances, since emission originating from, e.g. a TE1 mode that encounters a TE2 reflectivity resonance at the same angle will experience loss.

The number of non-overlapping resonances is determined by the angular width of each, which in turn depends on the low-n layer thickness as well as the extinction coefficient of the luminescent film 16. The resonances cannot be made arbitrarily narrow since the associated increase in cavity Q-factor leads to more initial reabsorption loss, reducing the quantum yield of emission into the substrate 12. The substrate-coupled quantum yield of the cavity structure thus depends on dlow. It can usually be made comparable to or greater than that of the corresponding non-cavity, though in general, the optimum low-n layer thickness decreases as the substrate 12 refractive index increases. In FIG. 5d, all of the cavities share dlow=230 nm, and hence the power ratios for the SF10-based cavities are lower than their glass counterparts.

Resonance-shifting is most effective for thin luminescent films 16, less than ~1 µm thick that support only one or two modes of each polarization, since highly multimode films make it difficult to avoid overlapping resonances. Dense, strongly absorbing films of organic chromophores or colloidal quantum dots with absorption lengths of a few hundred nanometers are thus well suited for this approach. Although quenched in neat film here, the photoluminescent quantum yield of the Lumogen dyes can be greatly increased by doping into a host matrix, though it should be noted that similar red perylene dyes exhibiting high quantum yield in neat film have also been developed. Colloidal quantum dots, in many respects ideal for use in LSCs 10 due to their broad absorption and tunable emission, may especially benefit from the resonance-shifting approach, as their use to date has been particularly hampered by high reabsorption losses.

Ultimately, RSLSCs retain the potential for low-cost fabrication, taking advantage of solution processable low-index and luminescent layers 16 as well as additive stamp-transfer processes to pattern the thickness variation 18 in a roll-to-roll fashion. One of ordinary skill in the art will appreciate that the present invention need not be limited by the mechanism utilized to achieve resonance shifting and other ways of achieving resonance-shifting are contemplated. For example, the luminescent film 16 thickness need not be varied at all if a substrate 12 with a shallow, slowly varying lower surface profile are used (e.g. reflecting light back at slightly different angles), though this could lead to unacceptable out-coupling loss from rays returned below the critical angle. Another way to achieve resonance-shifting is to laterally vary the refractive index gradient in the substrate 12. Still another way to achieve resonance-shifting is to use a curved substrate 12 (e.g. a glass plate deformed into a demisphere, parabloid, or the like), with a luminescent thin film 10 disposed on one side. One skilled in the art will appreciate that other mechanisms for achieving resonance shifting may be employed without deviating form the spirit of this disclosure.

Example—Sample Fabrication, Measurement and Data Analysis

Borosilicate glass microscope slides (60 mm×25.4 mm×1 mm, Fischer) and polished pieces of SF10 glass (58 mm×25.4 mm×1.15 mm, VPG optical glass) were used as substrates 12. Low refractive index layers were fabricated using the sacrificial porogen method as detailed previously, which produces uniform optical quality films with RMS surface roughness <2 nm and a nearly dispersionless refractive index of nlow~1.14. Films of F8BT were first spin-coated from p-xylene on a water-soluble sacrificial layer and then float-transferred onto the nanoporous low index spacer layer to produce a well-defined interface. The L170 and L305 cavities were produced by thermally evaporating the dyes directly onto the low-n layer. Optical constants and layer thicknesses were determined from global fitting of variable-angle spectroscopic ellipsometry and normal incidence transmission measurements.

Resonance-shifted stripe regions in the F8BT cavities were produced by thermally evaporating Alq3 through a shadow mask, whereas additional L170 and L305 was deposited in the case of the Lumogen cavities. The stair-step pattern of the full RSLSCs was built up sequentially using the appropriate series of shadow masks and was simultaneously deposited on the LSC 10 control devices (which have no low-n layer) to maintain comparable absorption to the RSLSCs.

Cavity reflectivities were collected as a function of angle via an equilateral prism index-matched to the back of each substrate 12 using λ=543 nm and λ=635 nm lasers for the F8BT and Lumogen-based cavities, respectively. Angular emission patterns of the F8BT cavity on glass were obtained exciting at λ=473 nm, out-coupling with an index-matched half-ball lens and detecting with an angular resolution of 0.1 degrees. Both reflectivity and emission signals were chopped at 300 Hz and detected with a Si photodiode 20 and lock-in amplifier.

Luminescence was detected from the concentrator edge by attaching directly to the surface of a bare, rectangular Si photodiode 20 (5 mm×25.4 mm, Silonex) with index-matching fluid (n=1.52 for glass, n=1.72 for SF10, Cargille Labs) to prevent any air gaps. The remaining three edges were blackened with ink to minimize edge reflections, which complicate the modeling analysis. Laser excitation (λ=473 nm for F8BT and L170, λ=543 nm for L305) was chopped at 300 Hz and directed onto the cavity surface approximately 5 degrees from normal incidence. The focal point (~200 µm diameter) was scanned as a function of position, x, along the middle of each sample while synchronously collecting the edge luminescence, transmitted, and reflected beam intensities at each point. The optical internal quantum efficiency was calculated using these data and then corrected for the solid angle change multiplying by $\pi/2 \tan^{-1}(w/2x)$ as previously, where w is the length of the edge with the attached photodiode 20. This correction is not valid for small x on the order of the 1 mm substrate 12 thickness and hence the propagation efficiency, ηprop (x), was estimated relative to the point x=5 mm through the relationship IQE(x)=$\eta_{em}\eta_{prop}$ (x) for the LSC 10 control, since the emission quantum yield, ηem, is constant throughout. The emission quantum yield is not constant crossing over the resonance-shifted stripe region of the cavities and so in this case the propagation efficiency is derived by geometrically averaging the complementary cavity data to deconvolve changes in $\eta_{em}$ according to the following:

$$\sqrt{\overline{IQE_{RS-}(x)IQE_{RS+}(x)}} = \eta_{prop,avg}(x)\sqrt{\eta_{em+}\eta_{em-}} \quad [5]$$

Edge-emission spectra were collected through the port of an integrating sphere that was fiber-coupled to a cooled Si CCD spectrograph.

Broad area illumination with an intensity of approximately 30 mW/cm2, chopped at 300 Hz and incident normal to the sample, was provided by a quartz-tungsten-halogen lamp homogenized using a tapered light pipe to achieve spatial uniformity with <1% r.m.s. intensity variation. The photodiode 20 was attached and the other edges blackened as above, with a small cover used to prevent direct illumination of the photodiode 20. The lamp output was subsequently shortpass filtered below $\lambda=500$ nm to minimize noise from scattered near-infrared light not absorbed by the luminescent film layers 16, and testing of blank samples (e.g. plain glass) ensured that stray light remained negligible in comparison to the luminescence signal.

Anisotropic transfer matrix modeling was used to fit the angular reflectivity data for the F8BT cavities since these films are uniaxial, with ordinary and extraordinary refractive indices no=1.70 and ne=1.65, and isotropic extinction k=1.5×10−4 at $\lambda=543$ nm as previously. The model fits for the F8BT cavity in FIG. 2b are reproduced in FIG. 8a (TE polarization) and 8b (TM polarization), excluding prism-coupling reflections to show the true internal reflectivity of the cavity. The plots with circles denote reflectivity of the F8BT cavity and the plots with squares show reflectivity of the F8BT control, where the same film lies directly on the glass substrate 12. Deviation from unity indicates reabsorption since no light is transmitted beyond the critical angle (~42°). It is clear that loss is much lower for non-resonant cavity angles than it is across all angles for the film on glass.

Figure 8:
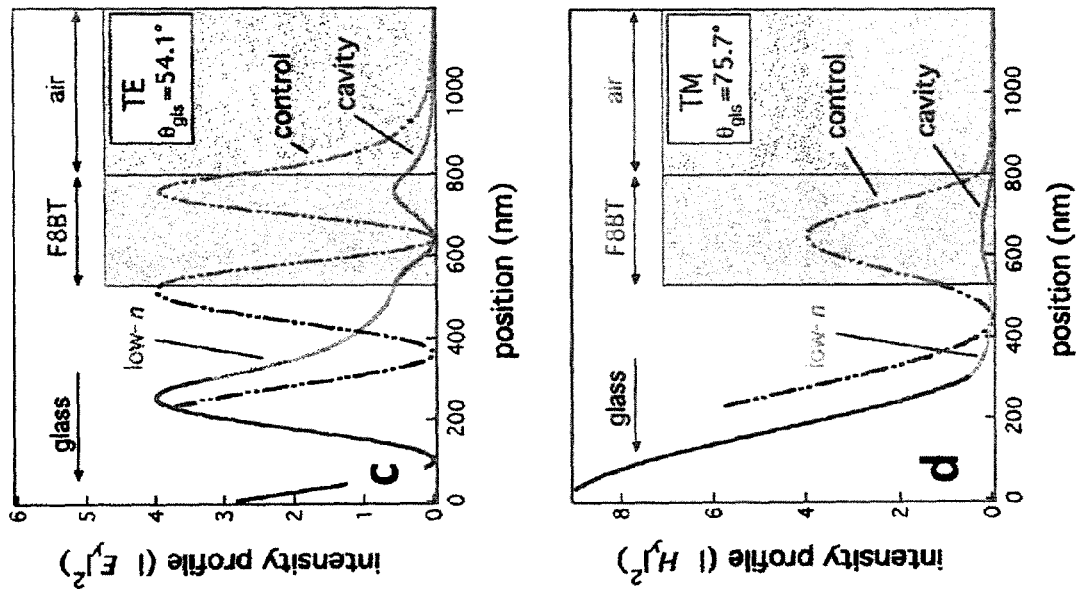
FIGS. 8a-d illustrate reflectivity and optical field intensity profiles calculated from fits to the data of the F8BT cavity in FIG. 3b.
Figure 8:
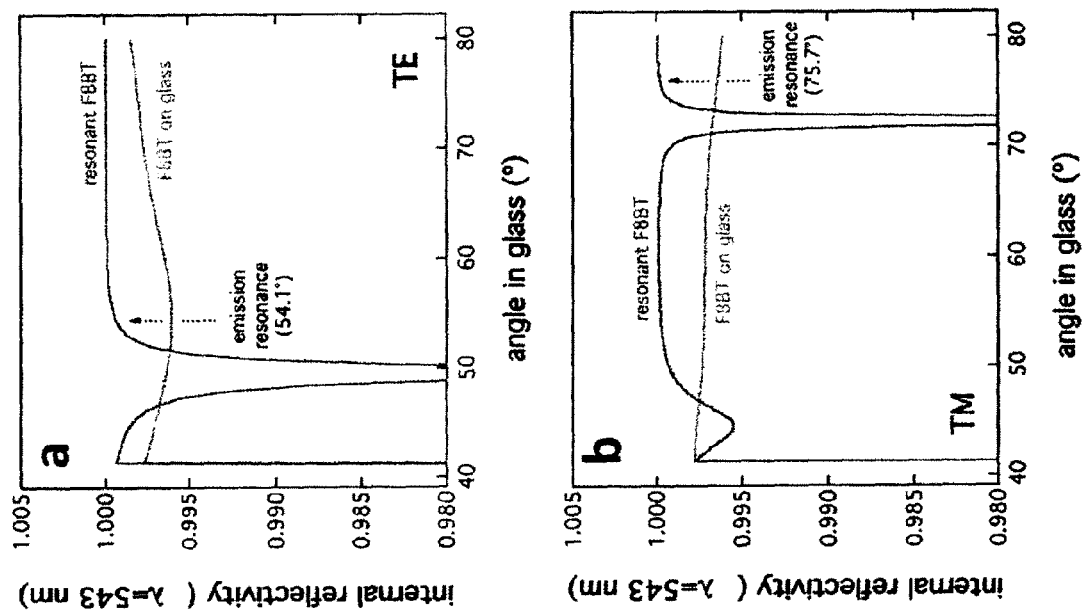

Dashed arrows in FIGS. 8a and 8b indicate the peak position of emission from the resonance-shifted stripe in FIG. 3. At these angles, emission is subject to 6- and 12-fold reductions in reabsorption at each reflection as compared to the control film for TE and TM polarizations respectively. FIGS. 8c and 8d show the intensity profiles (|Ey|2 for TE and |Hy|2 for TM polarizations) that correspond to these particular angles, demonstrating the suppression of fields in the F8BT film that occurs off resonance. Averaged over all non-resonant angles, reabsorption loss for the cavity is a factor of 38× and 15× lower than the control film for TE and TM polarized emission, respectively.

Global fits of variable angle spectroscopic ellipsometry and normal incidence transmission data are used to extract the optical constants of each film for modeling. Since this procedure is not sensitive to the weak extinction present below the absorption edge of each material, extinction coefficients determined from the resonant reflectivity fitting ($\lambda=543$ nm for F8BT, $\lambda=635$ nm for L170 and L305) are used as data points to fix the magnitude at these wavelengths and then extrapolate the functional decay determined by ellipsometry.

Figure 9:
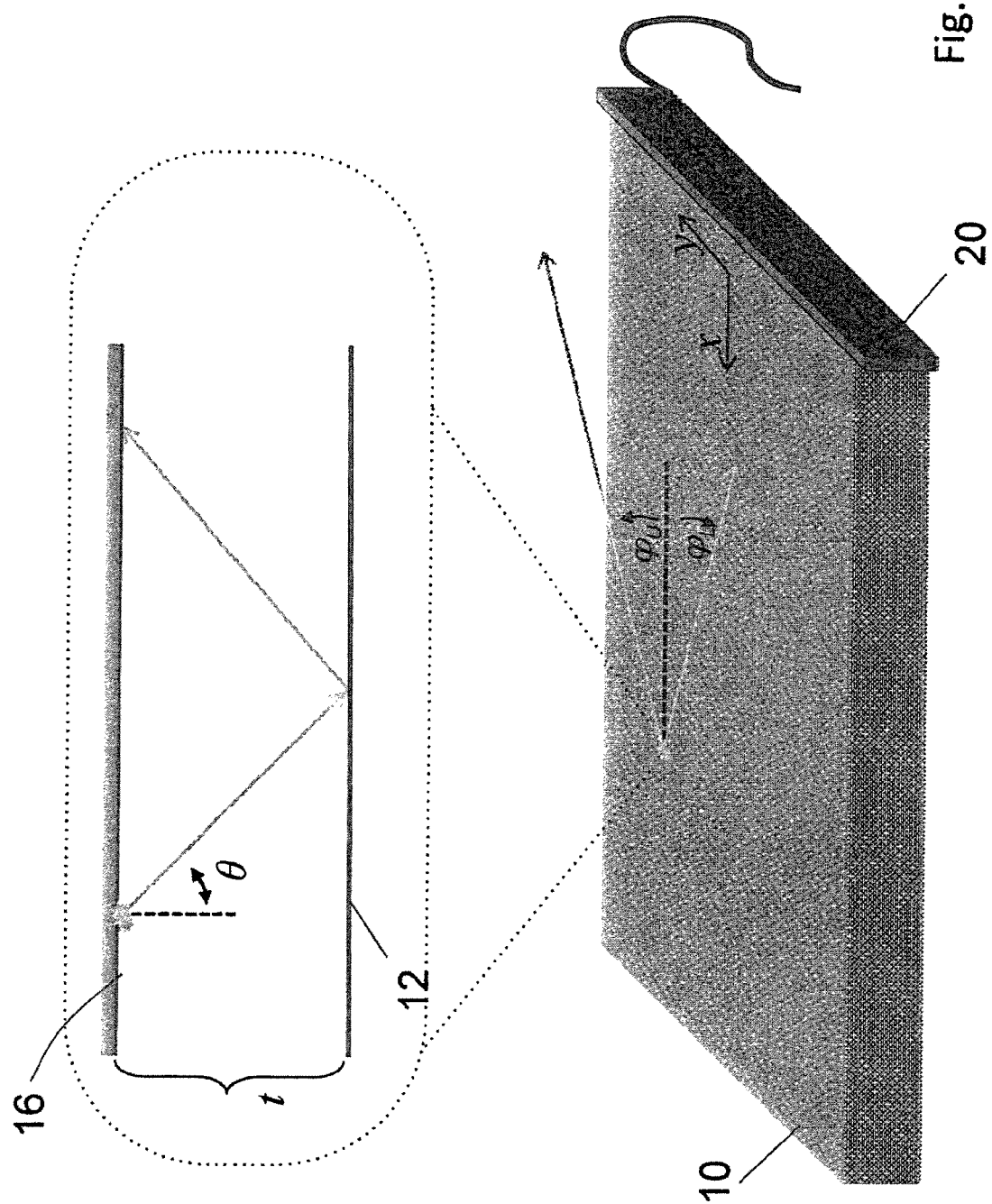
FIG. 9 illustrates the geometry and variable definitions used in the model calculations.

Total dipolar radiated and dissipated (into the lossy luminescent film 16) power, was calculated for the cavities numerically using the method of source terms, assuming randomly oriented dipoles distributed throughout the emissive layer and excited in proportion to the amount of incident light absorbed at each position. From this the total power is obtained for each polarization emitted into the substrate 12 as a function of angle for each wavelength in the emission spectrum, normalized to the calculated substrate-coupled emission quantum yield:

$$\eta_{em}(\lambda) = 2\pi \int [I_{TE}(\theta,\lambda) + I_{TM}(\theta,\lambda)] \sin(\theta) d\theta, \quad [\text{Equation 1}]$$

where $\theta$ is the angle in the substrate 12 and ITE and ITM are the TE and TM polarized power patterns, respectively. Using the transfer matrix-calculated reflectivities, $R_{TE}(\theta,\lambda)$ and $R_{TM}(\theta,\lambda)$, the respective propagation losses in the $\hat{x}$ direction for each emitted angle according to the geometry illustrated in FIG. 9 is as follows:

$$\alpha_{TE}(\theta, \phi, \lambda) = \frac{-\ln(R_{TE})}{2t(\tan\theta\cos\phi)} \text{ and } \alpha_{TM}(\theta, \phi, \lambda) = \frac{-\ln(R_{TM})}{2t(\tan\theta\cos\phi)}. \quad [\text{Equation 2}]$$

The power reaching the photodiode 20 at the right-hand edge (see FIG. 9) from a given location (x,y) at wavelength, $\lambda$, is then given by integrating over solid angle:

$$I(x,y,\lambda) = \int_{\phi_L}^{\phi_U}\int_0^{\pi/2} [I_{TE}\exp(-\alpha_{TE}x) + I_{TM}\exp(-\alpha_{TM}x)] \sin\theta d\theta d\phi, \quad [\text{Equation 3}]$$

where the azimuthal angular limits are:

$$\phi_L = \tan^{-1}\left[\frac{w/2+y}{x}\right] \text{ and } \phi_U = \tan^{-1}\left[\frac{w/2-y}{x}\right]. \quad [\text{Equation 4}]$$

Integrating Equation 3 over the normalized photoluminescence spectrum gives the total power arriving from each position. Secondary re-emission events (e.g. emission following reabsorption) are neglected and light scattered from the other edges are not accounted for since this is minimized by edge blackening in our experiments. Further integration of Equation 3 over x and y gives the edge-intensity under area illumination. Symmetry considerations and the appropriate change of variables in Equation 3 enable the calculation of light from all edges.

Figure 6:
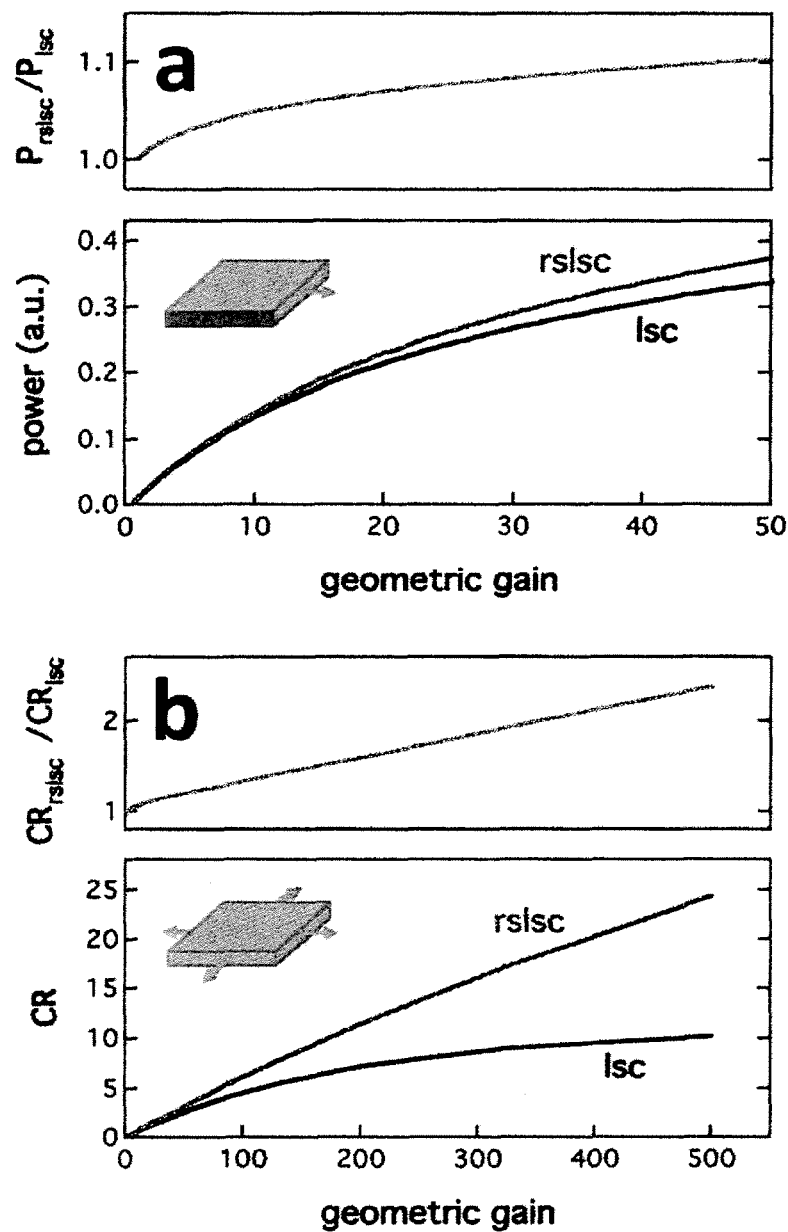
FIGS. 6a-b depicts simulation of concentrator performance.

The simulation of ideally patterned RSLSCs in FIG. 6 assumes that emission from a given point never re-encounters its own reflectivity resonance. As the optimum pattern is not yet known, this condition is artificially enforced in the simulation by ensuring that the layer thickness for each emitting point is always different than the rest of the structure (i.e. if light is emitted from a point with layer thickness dem, then the rest of the surface has layer thickness dem+30 nm).

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method for increasing the efficiency of a luminescent solar concentrator, comprising:
   providing a transparent substrate;

providing a low refractive index layer to a surface of the transparent substrate; and providing a continuous luminescent film of laterally varying thickness, the laterally varying thickness defining a first thickness at a first location and a second thickness at a second location, such that the low refractive index layer is disposed between the transparent substrate and the luminescent film.

2. The method of claim 1, wherein the continuous luminescent film is deposited onto a transfer medium by spin coating and is transferred to the low refractive index layer on the transparent substrate by float transfer.

3. The method of claim 2, wherein the variable thickness of the continuous luminescent film is provided by depositing variable amounts of continuous luminescent film onto the transfer medium.

4. The method of claim 1, wherein the low refractive index layer has a refractive index of about 1.1 to about 1.2.

5. The method of claim 4, wherein the low refractive index layer has a refractive index of about 1.14.

6. The method of claim 1, wherein the first location is spaced from the second location such that resonant emission from either of the first and the second locations of the continuous luminescent film does not re-encounter that same resonance in reflectivity.

7. The method of claim 1, evanescently coupling the continuous luminescent film to the transparent substrate.

8. The method of claim 1 wherein the continuous luminescent film comprises a thickness of one micron or less and the lateral varying thickness of the continuous luminescent film comprises a step-wise thickness variation.

9. The method of claim 1, further comprising emitting light through the continuous luminescent film at a first position, then transmitted within the transparent substrate, and is reflected off the continuous luminescent film at a second position, wherein the continuous luminescent film thickness at the first position being different than the thickness at the second position.

* * * * *